(12) United States Patent
Roberds (10) Patent No.: US 6,518,109 B2
(45) Date of Patent: Feb. 11, 2003

(54) TECHNIQUE TO PRODUCE ISOLATED JUNCTIONS BY FORMING AN INSULATION LAYER

(75) Inventor: Brian Roberds, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/106,153

(22) Filed: Mar. 26, 2002

(65) Prior Publication Data

US 2002/0098667 A1 Jul. 25, 2002

Related U.S. Application Data

(62) Division of application No. 09/752,335, filed on Dec. 29, 2000, now Pat. No. 6,399,973.

(51) Int. Cl.[7] ............................................. H01L 21/336
(52) U.S. Cl. ....................................... 438/197; 438/303
(58) Field of Search .................................. 438/197, 303

(56) References Cited

U.S. PATENT DOCUMENTS

| | | | | |
|---|---|---|---|---|
| 6,069,046 A | * | 5/2000 | Gardner et al. | 438/305 |
| 6,124,156 A | * | 9/2000 | Widmann et al. | 438/199 |
| 6,232,160 B1 | * | 5/2001 | Shih et al. | 438/197 |
| 6,252,277 B1 | * | 6/2001 | Chan et al. | 257/330 |
| 2000/0004290 | * | 1/2002 | Gruening et al. | 438/484 |

* cited by examiner

*Primary Examiner*—Olik Chaudhuri
*Assistant Examiner*—David S Blum
(74) *Attorney, Agent, or Firm*—Blakely, Sokoloff, Taylor & Zafman LLP (57) ABSTRACT

A method for isolating a source and a drain in an MOS transistor by forming an insulation layer adjacent to the source and an insulation layer adjacent to the drain, and an apparatus produced from such a method.

19 Claims, 6 Drawing Sheets

TECHNIQUE TO PRODUCE ISOLATED JUNCTIONS BY FORMING AN INSULATION LAYER

CROSS-REFERENCE TO RELATED APPLICATIONS

This application is a divisional of application Ser. No. 09/752,335, which was filed on Dec. 29, 2000, now U.S. Pat. No. 6,399,973.

FIELD OF THE INVENTION

A method for producing isolated junctions in a metal-oxide-semiconductor (MOS) transistor described. More specifically, the present invention describes a method for isolating the source and the drain of the transistor by forming an insulation layer adjacent to the source and an insulation layer adjacent to the drain.

BACKGROUND OF THE INVENTION

A conventional metal-oxide-semiconductor (MOS) transistor generally includes a semi-conductor substrate, such as silicon, having a source, a drain, and a channel positioned between the source and drain. A gate stack comprised of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

A problem that arises in MOS transistors involves an internal current leakage between the source and drain. Internal current leakage is one of the limiting factors in the scaling of MOS transistors to smaller dimensions. As the source and drain physically approach one another, the drain potential may couple into the channel, causing Drain-Induced Barrier Lowering (DIBL). This DIBL results in a current leakage between the source and drain, and at short channel lengths can result in failure of the transistor. Also as the dopant levels in the junctions increase and the physical dimensions become smaller the p-n junction leakage increases.

Another problem that arises in MOS transistors involves an external current leakage between the source and/or drain and a neighboring transistor or other structures. When transistors are densely packed, current leakage across neighboring transistors and/or other structures can decrease the efficiency of the transistor and/or other structures.

A third problem that arises in MOS transistors involves parasitic capacitance. Parasitic capacitance, associated with all p-n junctions, tends to slow the maximum switching speed of the transistor.

A prior art technique to control the external current leakage and to reduce capacitance associated with junctions is to use a silicon-on-insulator (SOI) structure. However, the SOI structure has several undesirable consequences. Using the SOI structure, the source, drain and channel are formed on the insulator. Although the insulator isolates the source and drain from other devices, it also isolates an area under the channel, a sub-channel region. As the transistor operates, charges can accumulate in the sub-channel region. Since the sub-channel is isolated by the insulator a "floating body", which allows the channel potential to vary during device operation, is produced. In addition, in many cases the insulator is a poor thermal conductor. As a result, as the transistor operates, the insulator absorbs and traps in a large amount of heat energy, raising the temperature of the transistor. The present invention addresses some of the shortcomings noted above.

BRIEF DESCRIPTION OF THE DRAWINGS

The present invention is illustrated by way of example and is not limited by the accompanying figures.

DETAILED DESCRIPTION OF THE INVENTION

The description discloses a method for producing isolated junctions in an MOS transistor and an apparatus produced from such a method. The following detailed description contains numerous specific details in order to provide a more thorough understanding of the present invention. However, it will be apparent to those skilled in the art to which this invention pertains that the present invention may be practiced without these specific details. In other instances, well-known devices, methods, procedures, and individual components have not been described in detail in order to avoid obscuring the present invention.

Figure 1:
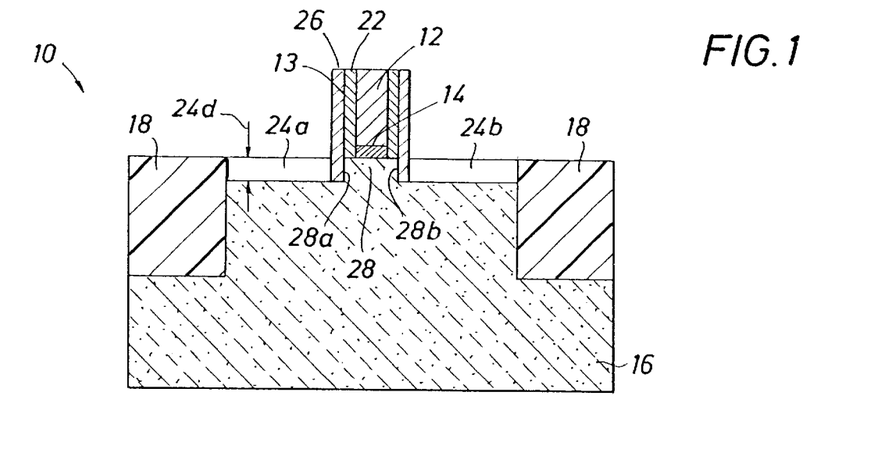
FIG. 1 is a side cross-sectional view of a partially fabricated MOS transistor showing a first removal of a portion of a semiconductor substrate and a formation of a set of sidewall spacers.

FIG. 1 shows a side cross-sectional view of a partially fabricated MOS transistor 10. The fabrication of the transistor 10 generally begins on a semiconductor substrate 16. The semiconductor substrate 16 is typically comprised of silicon and is typically doped at selected locations to form doped regions. In many cases the semiconductor substrate 16 is doped with boron, producing a p-type silicon region, or arsenic or phosphorous, producing an n-type silicon region, although other dopants may be used.

In many cases, the transistor 10 is placed in proximity to a large number of transistors or other devices. To help isolate the transistor 10 from these devices, isolation regions 18, typically comprised of an insulator, such as an oxide, are typically formed on the semiconductor substrate 16. A variety of techniques, including known techniques, can be used to form the isolation regions 18. Examples include, but are not limited to, growing a thermal oxide, depositing an oxide or depositing a nitride on the semiconductor substrate 16.

A gate stack 13 is fabricated atop the semiconductor substrate 16. A variety of techniques, including known techniques, can be used to fabricate the gate stack 13. For example, one gate stack fabrication technique includes depositing a gate oxide layer 14 above the semiconductor substrate 16, and depositing a gate conductor 12, such as polysilicon, above the gate oxide layer 14. Chemical vapor deposition (CVD) is one available technique to form the gate oxide 14 and gate conductor 12. Lithography techniques known in the art can be used to pattern the various gate stack 13 layers. Accordingly, in one embodiment, the gate oxide 14 and the gate conductor 12 are dry etched. Then a first set of sidewall spacers 22, typically comprised of an oxide, is formed adjacent to the gate conductor 12. The gate oxide 14, the gate conductor 12, and the first sidewall spacers 22 are collectively referred to as the gate stack 13. It is to be noted that other techniques can be used to form the gate stack 13.

FIG. 1 also shows a first removal of a portion of the semiconductor substrate 16 adjacent to a channel 28 of the semiconductor substrate 16, wherein the channel 28 underlies the gate stack 13. In one embodiment, the first removal is accomplished by a self-aligned, vertical, anisotropic etch. The anisotropic etch forms a first recess region 24a and a second recess region 24b adjacent to the channel 28 in the semiconductor substrate 16. The area remaining under the gate stack 13 and between the recess regions 24a and 24b defines the channel 28. The anisotropic etch continues vertically downward until a desired depth 24d is reached.

In one embodiment, the first removal is accomplished by a timed anisotropic etch, etching into the semiconductor substrate 16 for a predetermined amount of time in order to form the recess regions 24a and 24b.

After the first removal, a second set of sidewall spacers 26 is formed adjacent to the gate stack 13 and extends into the recess regions 24a and 24b to protect the first and second sidewalls 28a and 28b of the channel 28. A variety of techniques, including known techniques, can be used to form the second set of sidewall spacers 26. For example, a thin layer of a second sidewall spacer 26 material, such as a nitride, can be conformally deposited on an upper surface of the transistor 10 and a vertical anisotropic etch can be used to form the second sidewall spacers 26 to a desired distance from the sidewalls 28a and 28b of the channel 28. In one embodiment, the second sidewall spacers 26 and the first sidewall spacers 22 are comprised of different materials. For example, the first sidewall spacers 22 can be comprised of an oxide material and the second sidewall spacers 26 can be comprised of a nitride material.

Figure 2:
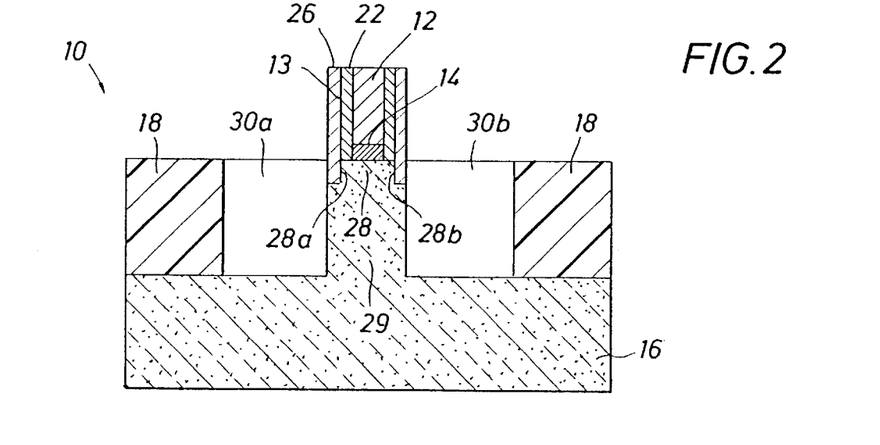
FIG. 2 is a side cross-sectional view of a partially fabricated MOS transistor showing a second removal of a portion of a semiconductor substrate to a structure shown in FIG. 1.

FIG. 2 shows a second removal of a portion of the semiconductor substrate 16. In one embodiment, the second removal is accomplished by a vertical anisotropic etch into the semiconductor substrate 16, aligned with the second sidewall spacers 26. The second removal extends the recess regions 24a and 24b further into the semiconductor substrate 16 forming a source region 30a and a drain region 30b. The area below the channel 28 and between the source and drain regions 30a and 30b defines a sub-channel region 29. In one embodiment, the second removal is accomplished by a timed anisotropic etch, etching into the semiconductor substrate 16 for a predetermined amount of time in order to form the source region 30a and the drain region 30b. Although FIG. 2 shows the depth of the source region 30a and the drain region 30b being even with the depth of the isolation region 18, other source region 30a and drain region 30b depths may be used to practice the invention.

Figure 3:
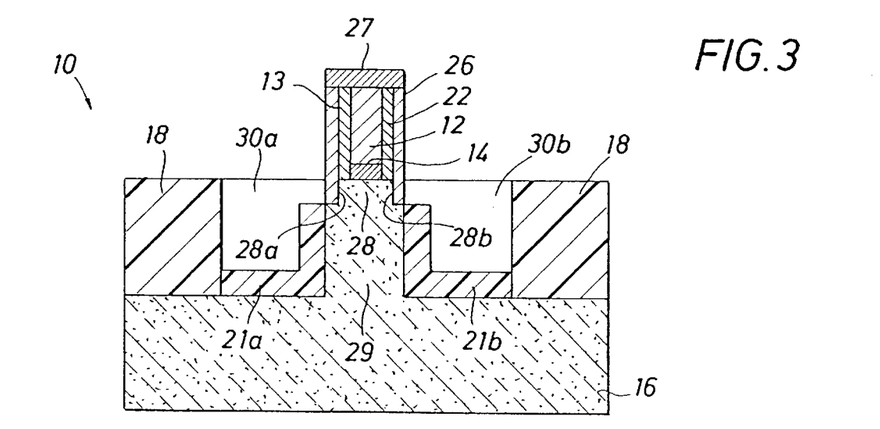
FIG. 3 is a side cross-sectional view of a partially fabricated MOS transistor showing a formation of insulation layers to a structure shown in FIG. 2.

FIG. 3 shows a formation of a first insulation layer 21a and a second insulation layer 21b. In one embodiment, the insulation layers 21a and 21b are formed by placing the transistor 10 in an oxygen ambient furnace (not shown). In the furnace, oxygen combines with any exposed silicon forming silicon dioxide, $SiO_2$. However, a measure may be taken to prevent $SiO_2$ from forming on the gate conductor 12, for example by forming a cap 27, made from a material such as a nitride material, above the gate conductor 12. Alternatively, $SiO_2$ may be allowed to form of the gate conductor 12 and then removed, for example by an etchant. Although the specific example of the insulation layers 21a and 21b being comprised of $SiO_2$ has been described, other insulation layers 21a and 21b and other methods for forming the insulation layers 21a and 21b may be used to practice the invention.

When a source 40a is formed in the source region 30a (shown in FIG. 6) and a drain 40b is formed in the drain region 30a, (shown in FIG. 6) the source 40a and the drain 40b are isolated on three sides. One side of the source 40a and drain 40b is isolated by the isolation regions 18 which prevent or reduce a current leakage directly from the source 40a and/or the drain 40b to a neighboring device (not shown) and vice versa. The opposite side of the source 40a and drain 40b, the side adjacent to the sub-channel region 29, is isolated by a vertical portion of insulation layers 21a and 21b which prevents or reduces a current leakage in the sub-channel region 29 from the source 40a to the drain 40b and vice versa. The lower surface of the source 40a and drain 40b is isolated by a horizontal portion of the insulation layers 21a and 21b which prevents or reduces a current leakage pathway from the source 40a and/or the drain 40b into the semiconductor substrate 16 and into a neighboring device and vice versa.

The isolation of the source 40a and drain 40b, described above, is accomplished without producing a "floating body". Other techniques, such as silicon-on insulator (SOI) isolate a source and a drain by covering an entire underside of a transistor with an insulator. Using this technique, a lower surface of a sub-channel region, as well as a lower surface of the source and drain, is isolated. As a result, the sub-channel region is said to be "floating". If the sub-channel region is not grounded, charges can accumulate in the sub-channel region as the transistor operates, dynamically altering the characteristics of the transistor. In addition, in many cases the insulator in the SOI structure is a poor thermal conductor. As a result, as the transistor operates, the insulator absorbs and traps in a large amount of heat energy, raising the temperature of the transistor.

In the present invention, the sub-channel region 29 is a subsection of the semiconductor substrate 16 and therefore is not isolated. As a result, a contact may be made to the semiconductor substrate 16 to control the potential in the sub-channel region 29, thus reducing or eliminating any "floating body" effects in the sub-channel region 29. In addition, the semiconductor substrate 16, comprised of a semiconductor material rather than an insulator, generally has a much higher thermal conductivity than the insulator used in the SOI structure. The relatively high thermal conductivity of the semiconductor substrate 16 allows for a greater dissipation of the heat produced during circuit operation, thus allowing the transistor 10 to operate at lower temperatures, increasing the efficiency of the transistor 10.

Figure 4:
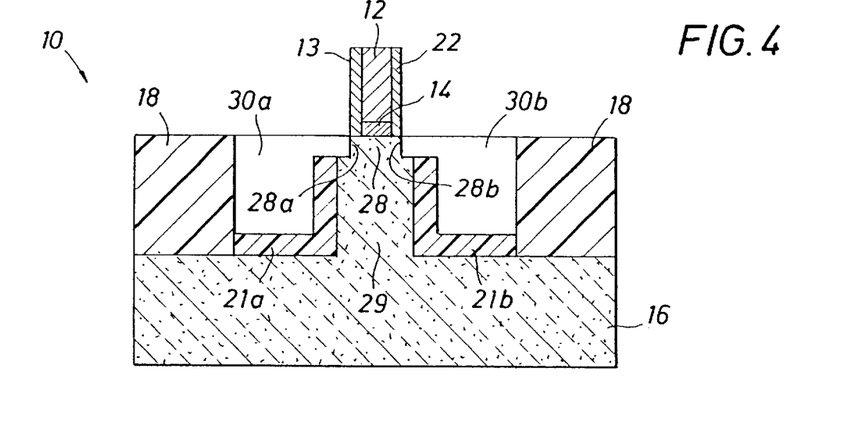
FIG. 4 is a side cross-sectional view of a partially fabricated MOS transistor showing a removal of a set of sidewall spacers to a structure shown in FIG. 3.

FIG. 4 shows a removal of the second sidewall spacers 26 and a formation of a source tip 36a and a drain tip 36b. The second sidewall spacers 26 are removed to expose the previously protected first sidewall 28a and second sidewall 28b of the channel 28. In an embodiment where the second sidewall spacers 26 are comprised of a nitride material, one removal technique includes dipping the transistor 10 in a solution of hot phosphoric acid. In an embodiment where a nitride cap 27 is used, the cap 27 can also be removed in this way. The phosphoric acid removes the nitride second sidewall spacers 26 and the nitride cap 27 while leaving the remainder of the transistor 10, such as the first sidewall spacers 22, the channel 28 and the insulation layers 21a and 21b, intact.

Figure 5:
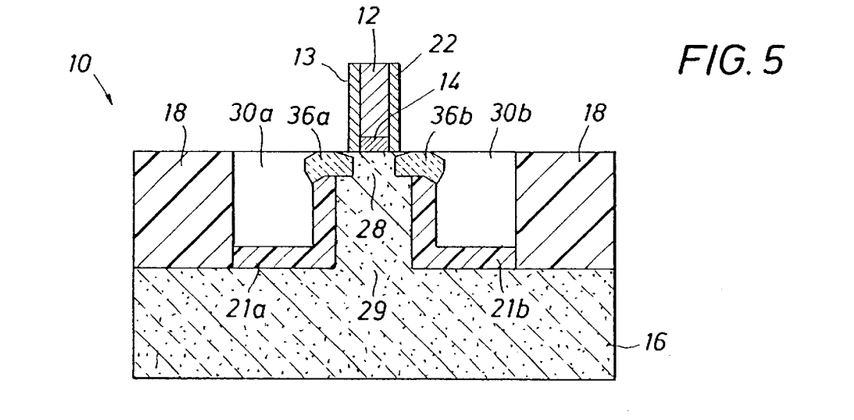
FIG. 5 is a side cross-sectional view of a partially fabricated MOS transistor showing a formation of a source tip and a drain tip adjacent to a sidewall of a channel to a structure shown in FIG. 4.

Once the sidewalls 28a and 28b are exposed, the source tip 36a is formed on the first sidewall 28a and the drain tip 36b is formed on the second sidewall 28b. In one embodiment, the tips 36a and 36b are epitaxially grown (i.e. selectively grown only on crystallographic planes) on the sidewalls 28a and 28b of the channel 28 to a lateral distance from the sidewalls 28a and 28b in the approximate range of 2 to 500 Angstroms.

In one embodiment, the tips 36a and 36b are comprised of the same or a similar dopant, having an opposite polarity of the dopant contained in the channel 28. For example, the tips 36a and 36b can contain a dopant forming n-type silicon while the channel can contain a dopant forming p-type silicon.

Figure 6:
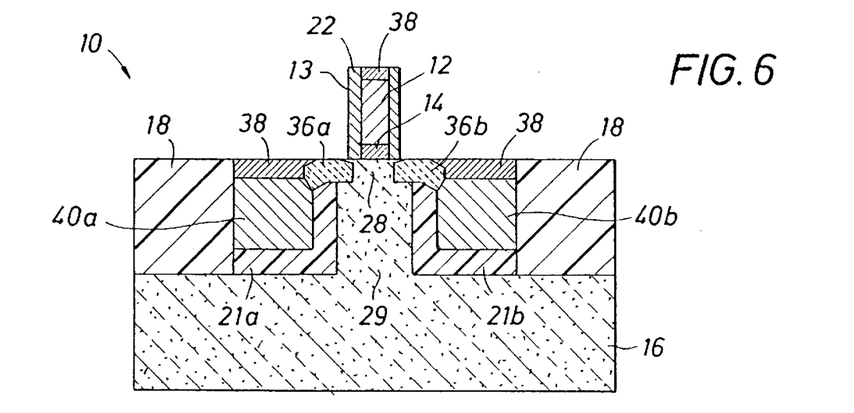
FIG. 6 is a side cross-sectional view of an MOS transistor showing a formation of a source and a drain, and a formation of salicide adjacent to the source, the drain and a gate conductor to a structure shown in FIG. 5.

FIG. 6 shows the formation of the source 40a in the source region 30a and the drain 40b in the drain region 30b. Various materials and methods of forming the source 40a and drain 40b may be used to practice the invention. In one embodiment, the source 40a and drain 40b are formed by doping polysilicon and depositing the polysilicon in the source region 30a and the drain region 30b. In many cases the polysilicon is doped with boron, producing a p-type silicon region, or arsenic or phosphorous, producing an n-type silicon region, although other dopants may be used. In another embodiment, the source 40a and drain 40b are formed by epitaxially growing a single crystal of silicon. Although, the source 40a and drain 40b are described as being comprised of silicon, other appropriate semiconducting or conducting materials may be used to form the source 40a and drain 40b.

In one embodiment, the source 40a and drain 40b have a uniform dopant concentration. In other embodiments, the source 40a and drain 40b have a graded increasing dopant distribution, a graded decreasing dopant distribution, or sections with higher dopant levels than other sections. Varying the dopant distribution within the source 40a and drain 40b varies the conductivity of the source 40a and drain 40b and can be used to help decrease current leakage and parasitic capacitance in the transistor 10.

After the source 40a and drain 40b are formed, salicide (self-aligned silicide) contacts 38 can be formed above the source 40a, the drain 40b and the gate conductor 12, providing good contact surfaces with low resistivity. A variety of techniques, including known techniques, can be used to form the salicide contacts 38. For example, the salicide contacts 38 can be formed by conformally depositing a metal such as nickel, tungsten or cobalt and providing heat so that the metal combines with any exposed silicon, i.e. the silicon from the source 40a, the drain 40b, and the gate conductor 12, to form salicide. The unreacted metal, such as the metal adjacent to the isolation region 18 and the first sidewall spacers 22 can be removed by selectively etching any unreacted metal.

Figure 7:
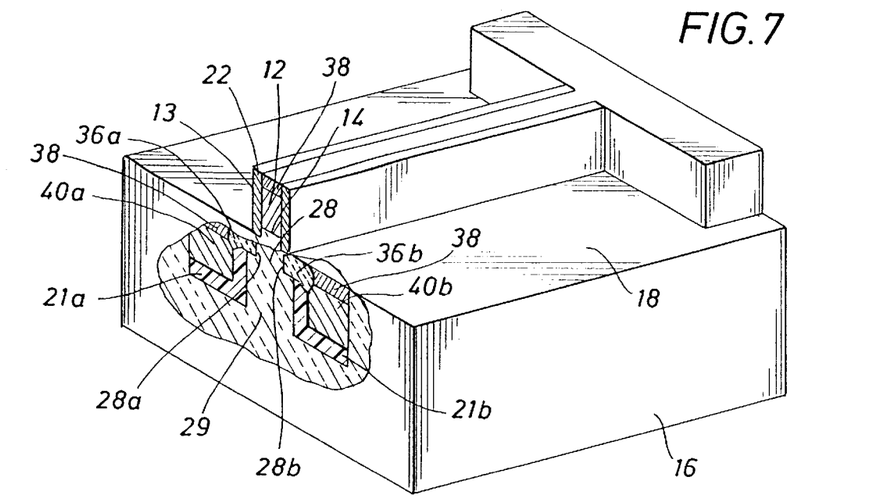
FIG. 7 is an isometric sectional view of an embodiment of an MOS transistor of the present invention.

FIG. 7 shows an embodiment of the invention. In this embodiment, the gate stack 13 is formed above the semiconductor substrate 16. Although a T-shaped gate stack 13 is shown, other configurations may be used to practice the invention. Adjacent to the gate stack 13 is the channel 28. Beneath the channel 28 is the sub-channel region 29. The isolation layers 21a and 21b isolate the source 40a and the drain 40b on one side of the source 40a and the drain 40b (i.e. the side adjacent to the sub-channel region 29) and on the lower surface of the source 40a and the drain 40b.

Figure 8:
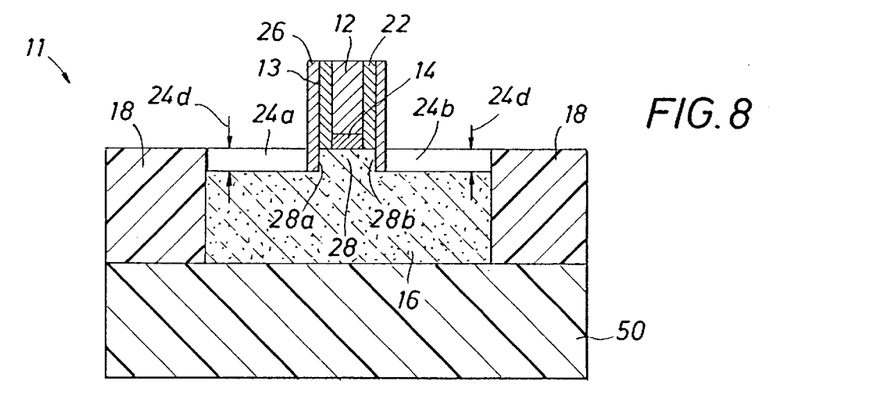
FIG. 8 is a side cross-sectional view of a partially fabricated MOS transistor showing a semiconductor substrate formed adjacent to an insulator. Also shown is a first removal of a portion of the semiconductor substrate and a formation of a set of sidewall spacers.

FIG. 8 shows another embodiment of the invention. The partially fabricated MOS transistor 11 shown in FIG. 8, can be fabricated in the same manner as is described above for the fabrication of the transistor 10 shown in FIG. 1. A difference between the transistor 10 and the transistor 11 is that in the transistor 11, the semiconductor substrate 16 is formed adjacent to an insulator 50. The insulator 50, like the isolation regions 18, is generally comprised of a dielectric material, such as an oxide, which helps isolate the transistor 11 from other transistors or devices placed in proximity to the transistor 11 by preventing or reducing the current leakage pathway from the source 40a and/or the drain 40b into the insulator 50 and into a neighboring device and vice versa.

Figure 9:
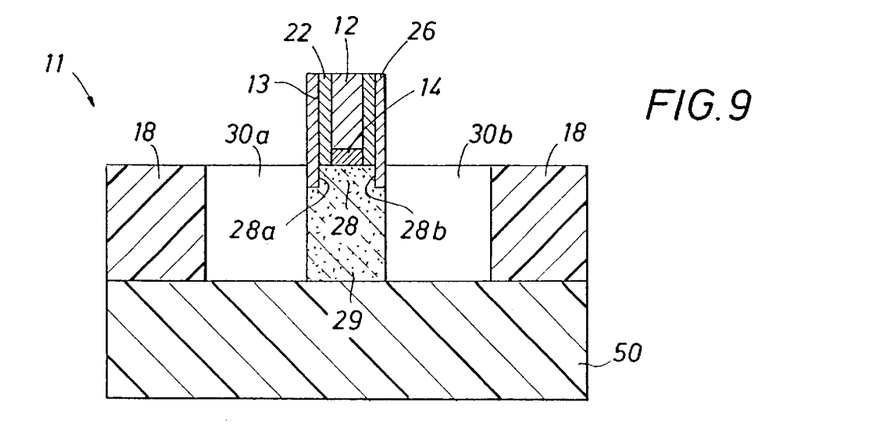
FIG. 9 is a side cross-sectional view of a partially fabricated MOS transistor showing a second removal of a portion of a semiconductor substrate to a structure shown in FIG. 8.

FIG. 9 shows the second removal of a portion of the semiconductor substrate 16. All of the methods described above for the second removal in the transistor 10 shown in FIG. 2 can be used in the transistor 11 shown in FIG. 9. However, in the transistor 11, the insulator 50 can function as an etch stop, such that the second removal can be accomplished by an anisotropic etch, etching into the semiconductor substrate 16 until it reaches the insulator 50.

Figure 10:
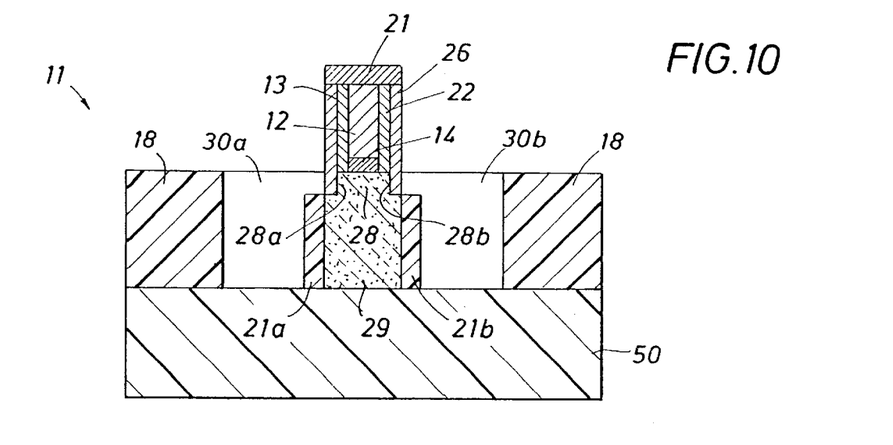
FIG. 10 is a side cross-sectional view of a partially fabricated MOS transistor showing a formation of insulation layers to a structure shown in FIG. 9.

FIG. 10 shows the formation of the first insulation layer 21a and the second insulation layer 21b. All of the methods described above for the formation of the insulation layers 21a and 21b in the transistor 10 shown in FIG. 3 can be used in the transistor 11 shown in FIG. 10, one difference being that in the transistor 11, the insulation layers 21a and 21b need only form on one side of the source and drain regions 30a and 30b (the side adjacent to the sub-channel region 29) rather than on two sides of the source and drain regions 40a and 40b as is shown in for the transistor 10 in FIG. 2 (the side adjacent to the sub-channel region 29 and the lower surface of the source and drain regions 30a and 30b).

In the arrangement for the transistor 11 shown in FIG. 10, when a source 40a is formed in the source region 30a (shown in FIG. 13) and a drain 40b is formed in the drain region 30a, (shown in FIG. 13) the source 40a and the drain 40b are isolated on three sides. One side of the source 40a and drain 40b is isolated by the isolation regions 18 which prevent or reduce a current leakage directly from the source 40a and/or the drain 40b to a neighboring device (not shown) and vice versa. The opposite side of the source 40a and drain 40b, the side adjacent to the sub-channel region 29, is isolated by the insulation layers 21a and 21b which prevent or reduce a current leakage in the sub-channel region 29 from the source 40a to the drain 40b and vice versa. The lower surface of the source 40a and drain 40b is isolated by the insulator 50 which prevents or reduces a current leakage pathway from the source 40a and/or the drain 40b into the semiconductor substrate 16 and into a neighboring device and vice versa.

Figure 11:
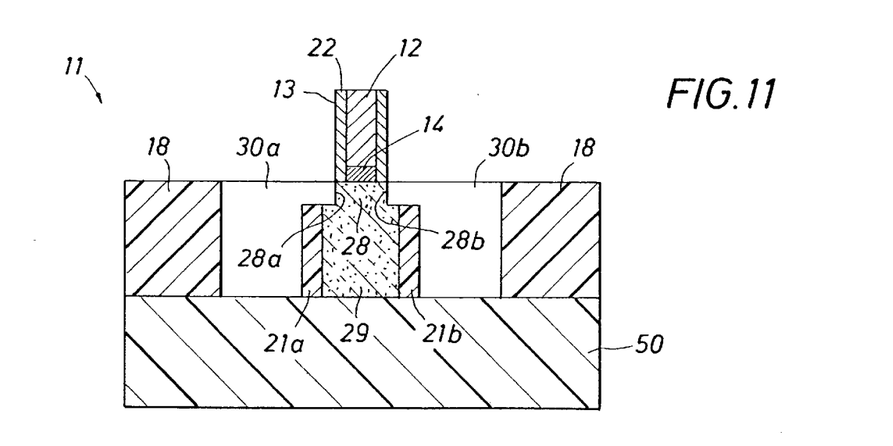
FIG. 11 is a side cross-sectional view of a partially fabricated MOS transistor showing a removal of a set of sidewall spacers to a structure shown in FIG. 10.
Figure 12:
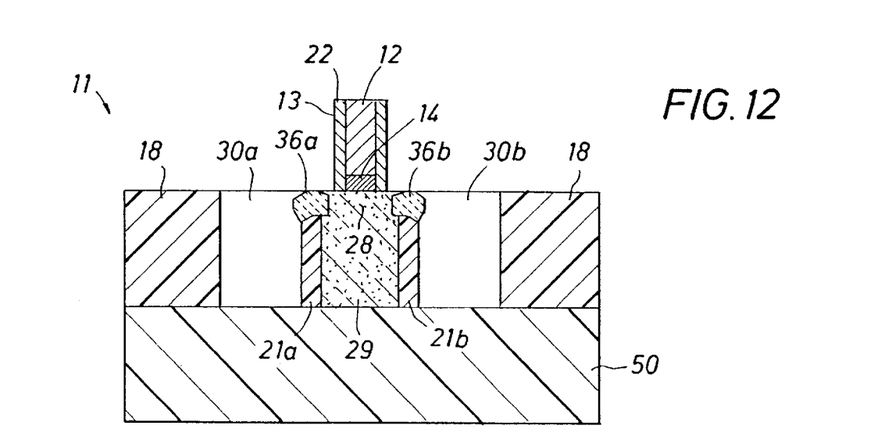
FIG. 12 is a side cross-sectional view of a partially fabricated MOS transistor showing a formation of a source tip and a drain tip adjacent to a sidewall of a channel to a structure shown in FIG. 11.
Figure 13:
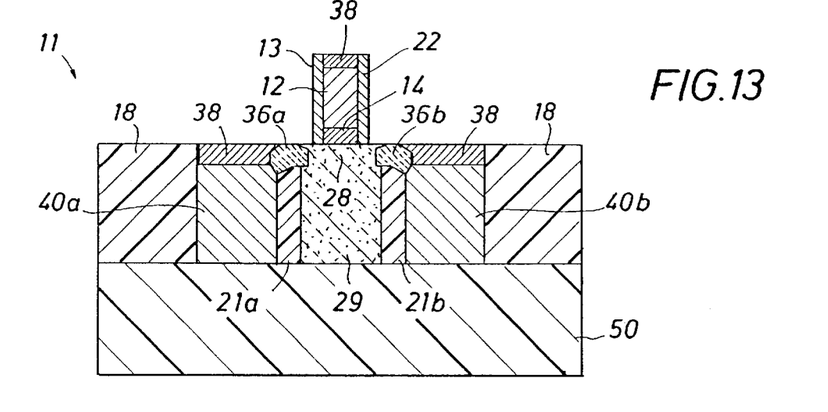
FIG. 13 is a side cross-sectional view of an MOS transistor showing a formation of a source and a drain, and a formation of salicide adjacent to the source, the drain and a gate conductor to a structure shown in FIG. 12.

The transistor 11 in FIGS. 11–13 can be fabricated in the same manner as is described above for the transistor 10 in FIGS. 4–6 except that the transistor 11 in FIGS. 11–13 does not contain the contact that controls the potential in the sub-channel region 29 that is contained in transistor 10.

Figure 14:
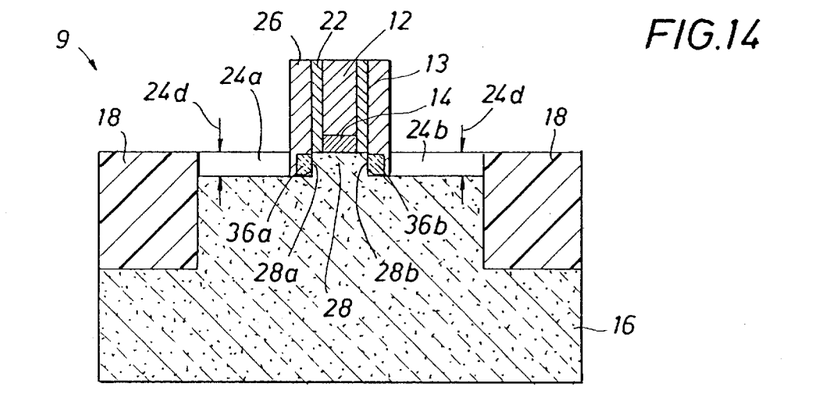
FIG. 14 is a side cross-sectional view of a partially fabricated MOS transistor showing a first removal of a portion of a semiconductor substrate, a formation of a source tip and a drain tip adjacent to a sidewall of a channel and a formation of a set of sidewall spacers adjacent.
Figure 15:
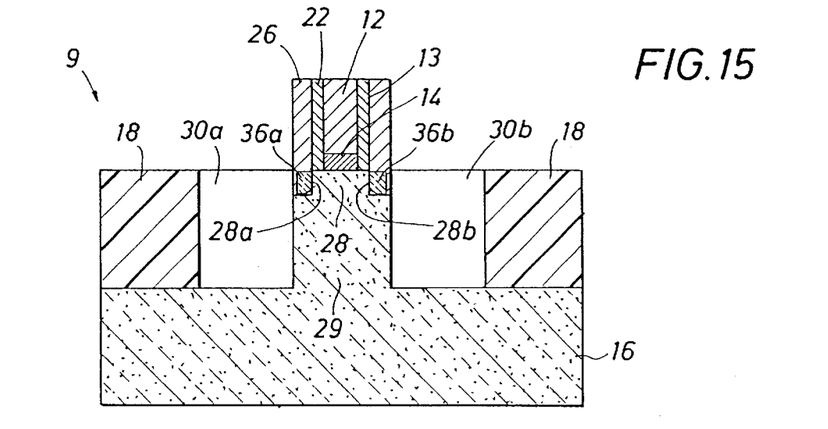
FIG. 15 is a side cross-sectional view of a partially fabricated MOS transistor showing a second removal of a portion of a semiconductor substrate to a structure shown in FIG. 14.
Figure 16:
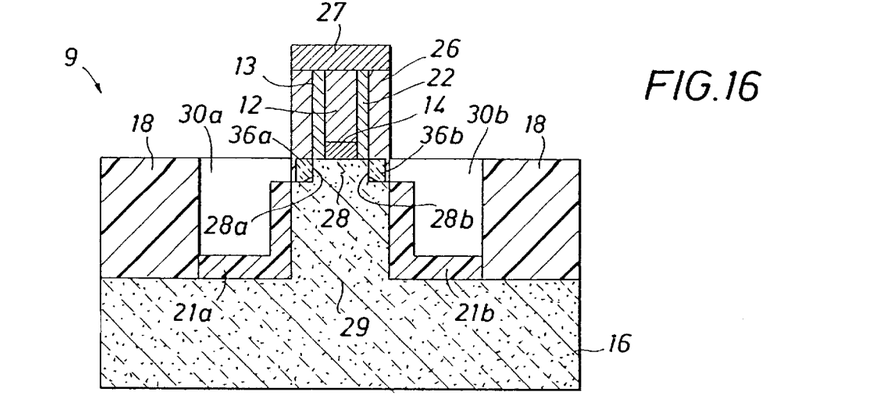
FIG. 16 is a side cross-sectional view of a partially fabricated MOS transistor showing a formation of insulation layers to a structure shown in FIG. 15.
Figure 17:
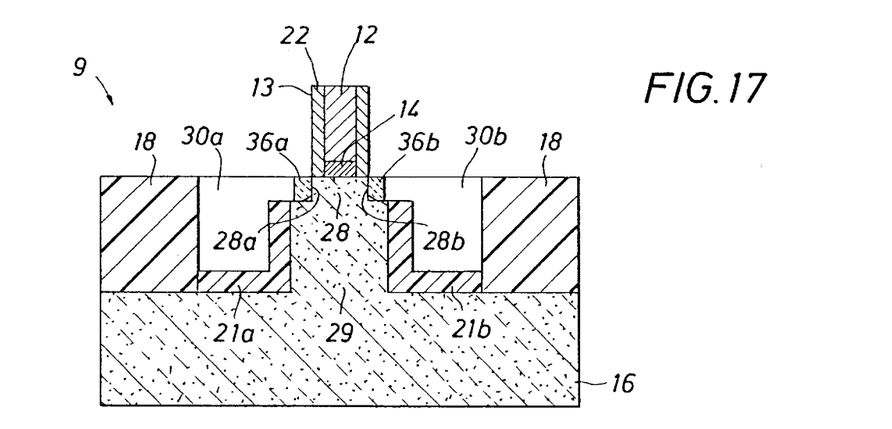
FIG. 17 is a side cross-sectional view of a partially fabricated MOS transistor showing a removal of a set of sidewall spacers to a structure shown in FIG. 16.
Figure 18:
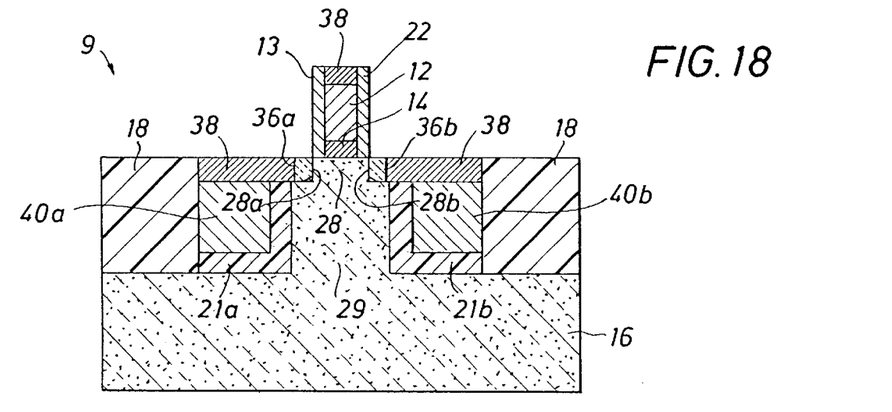
FIG. 18 is a side cross-sectional view of a partially fabricated MOS transistor showing a formation of a source and a drain, and a formation of salicide adjacent to the source, the drain and a gate conductor to a structure shown in FIG. 17.

FIG. 14 shows another embodiment of the invention. The partially fabricated MOS transistor 9 shown in FIG. 14, can be fabricated in the same manner as is described above for the fabrication of the transistor 10 shown in FIG. 1. However, while transistor 10 shows the formation of the second set of sidewall spacers 26 after the recess regions 24a and 24b are formed, transistor 9 shows the formation of the tips 36a and 36b after the recess regions 24a and 24b are formed and then the formation of the second sidewall spacers 26.

The transistor 9 shown in FIGS. 15–18 can be fabricated in the same manner as is described above for the transistor 10 in FIGS. 2–4, and 6–7.

Embodiments of the invention include a method for isolating a source and a drain in an MOS transistor by forming an insulation layer adjacent to the source and an insulation layer adjacent to the drain, and an apparatus produced from such a method. Embodiments of the invention allow for the isolation of the source and drain of an MOS transistor without producing a "floating body" in a sub-channel region. In addition, embodiments of the invention isolate the source and drain of the MOS transistor in a manner that produces less heat in the transistor than other methods, such as SOI.

Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

I claim:

1. A method comprising:
   removing a portion of a semiconductor substrate adjacent to a gate stack in order to form a source region and a drain region;
   forming an insulation layer on exposed portions of the semiconductor substrate within the source and drain regions; and
   forming a source and a drain by depositing material in the source and drain regions.

2. The method of claim 1, wherein the removing includes a first removal, the first removal being a vertical anisotropic etch into the semiconductor substrate, self-aligned with the gate stack, forming a first recess region and a second recess region, a region between the first and second recess regions defines a channel having a first sidewall and a second sidewall.

3. The method of claim 2, wherein a set of sidewall spacers are formed adjacent to the channel in the first and second recess regions to protect the first and second sidewalls of the channel.

4. The method of claim 3, wherein the removing further includes a second removal, the second removal being a vertical anisotropic etch into the semiconductor substrate aligned with the sidewall spacers forming the source and drain regions.

5. The method of claim 4, wherein the sidewall spacers are removed and a source tip is formed in the source region adjacent to the first sidewall of the channel and a drain tip is formed in the drain region adjacent to the second sidewall of the channel.

6. The method of claim 5, wherein the source and drain have a graded dopant distribution.

7. A method comprising:
   removing a first portion of a semiconductor substrate adjacent to a gate stack in order to form a first recess region and a second recess region, a region between the first and second recess regions defines a channel having a first sidewall and a second sidewall;
   forming a set of sidewall spacers adjacent to the channel in the first and second recess regions to protect the first and second sidewalls of the channel;
   removing a second portion of the semiconductor substrate adjacent to the sidewall spacers in order to form a source region and a drain region;
   forming an insulation layer on exposed portions of the semiconductor substrate within the source and drain regions; and
   forming a source and a drain by depositing material in the source and drain regions.

8. The method of claim 7, wherein the sidewall spacers are removed and a source tip is formed in the source region adjacent to the first sidewall of the channel and a drain tip is formed in the drain region adjacent to the second sidewall of the channel.

9. The method of claim 8, wherein the source and drain have a graded dopant distribution.

10. A method comprising:
    forming a semiconductor substrate above an insulator;
    removing a portion of the semiconductor substrate adjacent to a gate stack in order 4 to form a source region and a drain region;

forming an insulation layer on exposed portions of the semiconductor substrate within the source and drain regions; and forming a source and a drain by depositing material in the source and drain regions.

11. The method of claim 10, wherein the removing includes a first removal, the first removal being a vertical anisotropic etch into the semiconductor substrate, self-aligned with the gate stack, forming a first recess region and a second recess region, a region between the first and second recess regions defines a channel having a first sidewall and a second sidewall.

12. The method of claim 11, wherein a set of sidewall spacers are formed adjacent to the channel in the first and second recess regions to protect the first and second sidewalls of the channel.

13. The method of claim 12, wherein the removing further includes a second removal, the second removal being a vertical anisotropic etch into the semiconductor substrate aligned with the sidewall spacers forming the source and drain regions.

14. The method of claim 13, wherein the sidewall spacers are removed and a source tip is formed in the source region adjacent to the first sidewall of the channel and a drain tip is formed in the drain region adjacent to the second sidewall of the channel.

15. The method of claim 14, wherein the source and drain have a graded dopant distribution.

16. A method comprising:

removing a first portion of a semiconductor substrate adjacent to a gate stack in order to form a first recess region and a second recess region, a region between the first and second recess regions defines a channel having a first sidewall and a second sidewall;

forming a source tip in the first recess region adjacent to the first sidewall of the channel and a drain tip in the second recess region adjacent to the second sidewall of the channel;

forming a set of sidewall spacers adjacent to the source tip and the drain tip in the first and second recess regions;

removing a second portion of the semiconductor substrate adjacent to the sidewall spacers in order to form a source region and a drain region;

forming an insulation layer on exposed portions of the semiconductor substrate within the source and drain regions; and forming a source and a drain by depositing material in the source and drain regions.

17. The method of claim 16, wherein the source and drain have a graded dopant distribution.

18. The method of claim 17, wherein the first portion of the semiconductor substrate is removed by a timed vertical anisotropic etch into the semiconductor substrate, self aligned with the gate stack, forming the first and second recess regions.

19. The method of claim 18, wherein the second portion of the semiconductor substrate is removed by a timed vertical anisotropic etch into the semiconductor substrate aligned with the sidewall spacers forming the source and drain regions.

* * * * *